(12) United States Patent
Kakinuma

(10) Patent No.: US 10,332,783 B2
(45) Date of Patent: Jun. 25, 2019

(54) METHOD OF MANUFACTURING SEMICONDUCTOR DEVICE, AND SEMICONDUCTOR DEVICE

(71) Applicant: CANON KABUSHIKI KAISHA, Tokyo (JP)

(72) Inventor: Nobuaki Kakinuma, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/945,120

(22) Filed: Apr. 4, 2018

(65) Prior Publication Data
US 2018/0308747 A1  Oct. 25, 2018

(30) Foreign Application Priority Data
Apr. 19, 2017  (JP) ................................. 2017-083039

(51) Int. Cl.

| | |
|---|---|
| *H01L 23/52* | (2006.01) |
| *H01L 21/768* | (2006.01) |
| *H01L 23/528* | (2006.01) |
| *H01L 27/12* | (2006.01) |
| *H01L 27/146* | (2006.01) |
| *H01L 21/027* | (2006.01) |

(52) U.S. Cl.
CPC .. *H01L 21/76808* (2013.01); *H01L 21/76816* (2013.01); *H01L 23/5283* (2013.01); *H01L 27/124* (2013.01); *H01L 21/0276* (2013.01); *H01L 27/14603* (2013.01)

(58) Field of Classification Search
CPC ......... H01L 21/76816; H01L 21/76808; H01L 23/5283; H01L 27/124
See application file for complete search history.

(56) References Cited

U.S. PATENT DOCUMENTS

| | | | |
|---|---|---|---|
| 6,033,977 A | 3/2000 | Gutsche et al. | |
| 7,884,011 B2* | 2/2011 | Morimoto | ............. H01L 21/768 257/E21.579 |
| 9,691,719 B2* | 6/2017 | Tomita | ................ H01L 23/5283 |

(Continued)

FOREIGN PATENT DOCUMENTS

| | | |
|---|---|---|
| JP | 5-136020 A | 6/1993 |
| JP | 11-074356 A | 3/1999 |

(Continued)

*Primary Examiner* — Luan C Thai
(74) *Attorney, Agent, or Firm* — Venable LLP

(57) ABSTRACT

A method of manufacturing a semiconductor device is provided. The method comprises arranging an insulator, forming a hole in the insulator, first exposing for exposing a first portion of a photoresist arranged on the insulator, second exposing for exposing a second portion of the photoresist, after the first and second exposing, forming a trench in the insulator in accordance with etching the insulator using a resist pattern formed by developing the photoresist as a mask and embedding a conductor in the hole and the trench. The trench includes a first trench corresponding to the exposure of the first portion of the resist pattern and a second trench corresponding to the exposure of the second portion of the resist pattern. The first and second trench each communicate with the hole and the hole is deeper than the first and second trench.

20 Claims, 18 Drawing Sheets

(56) References Cited

U.S. PATENT DOCUMENTS

| | | | |
|---|---|---|---|
| 2010/0148313 A1* | 6/2010 | Komuro | G03F 7/70475 257/620 |
| 2015/0357293 A1 | 12/2015 | Tomita | |
| 2016/0295144 A1 | 10/2016 | Kimura | |
| 2017/0256506 A1 | 9/2017 | Tomita | |

FOREIGN PATENT DOCUMENTS

| | | | |
|---|---|---|---|
| JP | 2001-313336 A | 11/2001 | |
| JP | 2007-103723 A | 4/2007 | |
| JP | 2008-065214 A | 3/2008 | |
| JP | 2010-141093 A | 6/2010 | |
| JP | 2010-165737 A | 7/2010 | |
| JP | 2010-165760 A | 7/2010 | |
| JP | 2014-074904 A | 4/2014 | |
| JP | 2014-102292 A | 6/2014 | |
| JP | 2014-112740 A | 6/2014 | |
| JP | 2016-192467 A | 11/2016 | |
| WO | 2014/109044 A1 | 7/2014 | |

* cited by examiner

METHOD OF MANUFACTURING SEMICONDUCTOR DEVICE, AND SEMICONDUCTOR DEVICE

BACKGROUND OF THE INVENTION

Field of the Invention

The present invention relates to a method of manufacturing a semiconductor device, and a semiconductor device.

Description of the Related Art

A maximum exposure region for an exposure apparatus used in an exposure process for manufacturing a semiconductor device is restricted by the size of a projection lens that is used. Accordingly, a dividing exposure is used in order to manufacture a large-area semiconductor device. A dividing exposure is a technique for dividing a device region for forming a semiconductor device on a substrate into a plurality of regions, and separately exposing each region in order to expose the device region. In a dividing exposure, arranging an auxiliary pattern so that a pattern continuous across adjacent regions does not become discontinuous due to an alignment shift is known. Japanese Patent Laid-Open No. H5-136020 indicates reserving a region for performing a layout of an auxiliary pattern by, when forming a wiring pattern that passes through a boundary of adjacent regions, alternatingly forming adjacent wiring patterns in different wiring layers.

SUMMARY OF THE INVENTION

In the technique of Japanese Patent Laid-Open No. H5-136020, when a distance (shift amount) between division patterns to be connected increases, a resistance between the division patterns increases, and there is a possibility that a yield or reliability of wiring will decrease. In contrast to this, when the width of an auxiliary pattern increases, achieving miniaturization of the wiring pattern becomes difficult. In other words, the technique of Japanese Patent Laid-Open No. H5-136020 is insufficient in achieving both of miniaturization of wiring, and an improvement to yield and/or reliability.

Some embodiments of the present invention provide a technique advantageous in achieving both of miniaturization of wiring and improvement of yield and/or reliability.

According to some embodiments, a method of manufacturing an image capturing apparatus, a method of manufacturing a semiconductor device, the method comprising: arranging an insulation film on a substrate; forming a hole in the insulation film; first exposing for exposing a first portion of a photoresist arranged on the insulation film; second exposing for exposing a second portion of the photoresist after the first exposing; after the first exposing and the second exposing, forming a trench in the insulation film in accordance with etching the insulation film using a resist pattern formed by developing the photoresist as a mask; and embedding a conductor in the hole and the trench, wherein the trench includes a first trench corresponding to a first pattern formed by the exposure of the first portion out of the resist pattern, and a second trench corresponding to a second pattern formed by the exposure of the second portion out of the resist pattern, and in the embedding, the first trench and the second trench each communicate with the hole, and the hole is deeper than the first trench and the second trench, is provided.

According to some other embodiments, a semiconductor device comprising a device region that includes a first region and a second region adjacent to each other, wherein the semiconductor device has a wiring pattern that extends following a first direction spanning the first region and the second region, and is embedded in an insulation film on a substrate, the wiring pattern has a first portion arranged in a boundary portion that spans the first region and the second region, a second portion that extends from the boundary portion to a side of the first region, with a portion of the second portion being arranged on the first portion, and a third portion that extends from the boundary portion to a side of the second region, with a portion of the third portion being arranged on the first portion, and in an orthogonal projection with respect to the device region, at least one of a portion of an outer edge that follows the first direction out of the second portion and a portion of an outer edge that follows the first direction out of the third portion is arranged so as to overlap the first portion, is provided.

Further features of the present invention will become apparent from the following description of exemplary embodiments (with reference to the attached drawings).

DESCRIPTION OF THE EMBODIMENTS

Figure 1:
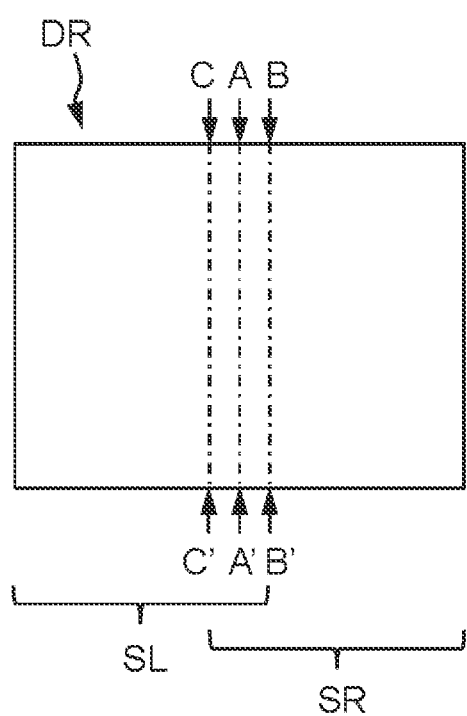
FIG. 1 is a conceptual view of an arrangement of a device region of a semiconductor device according to an embodiment of the present invention.

With reference to FIGS. 1 through 7D, description is given for a configuration of a semiconductor device according to an embodiment of the present invention, and a method of manufacturing the same. FIG. 1 is a plan view that conceptually illustrates an arrangement of a device region DR of a semiconductor device in a first embodiment of the present invention. One device region DR can be a region for one semiconductor chip. In the present embodiment, the device region DR is divided into a plurality of regions, and the device region DR is formed by a dividing exposure that separately exposes each region. Specifically, the device region DR is exposed, dividing into two regions, a region SL and a region SR. Although exposure is performed dividing the device region DR into the two regions SL and SR in the present embodiment, a dividing exposure dividing the device region DR into three or more regions may be performed.

As illustrated in FIG. 1, in the present embodiment, the region SL and the region SR for the dividing exposure of the device region DR include regions that overlap. The device region DR is divided into two regions at a line A-A'. In addition, a line B-B' and a line C-C' are defined based on the line A-A'. In FIG. 1, from a left end of the device region DR to the line B-B' is the region SL which is a portion exposed by using one photo-mask, and from the line C-C' to the right end of the device region DR is the region SR which is a portion exposed using one photo-mask.

Figure 2A:
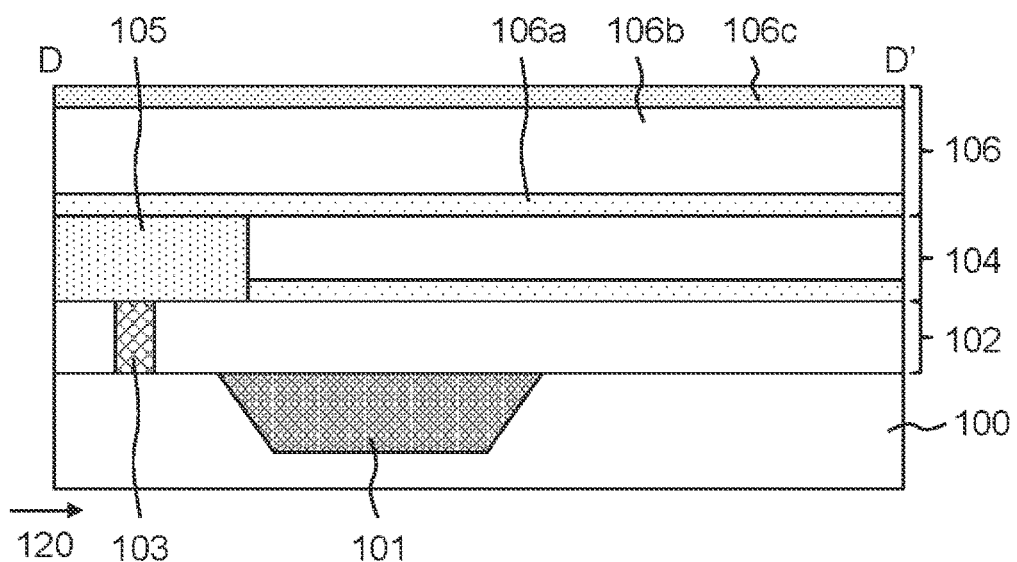
FIGS. 2A through 2D are cross-sectional views and plan views illustrating a method of manufacturing the semiconductor device of FIG. 1.
Figure 2B:
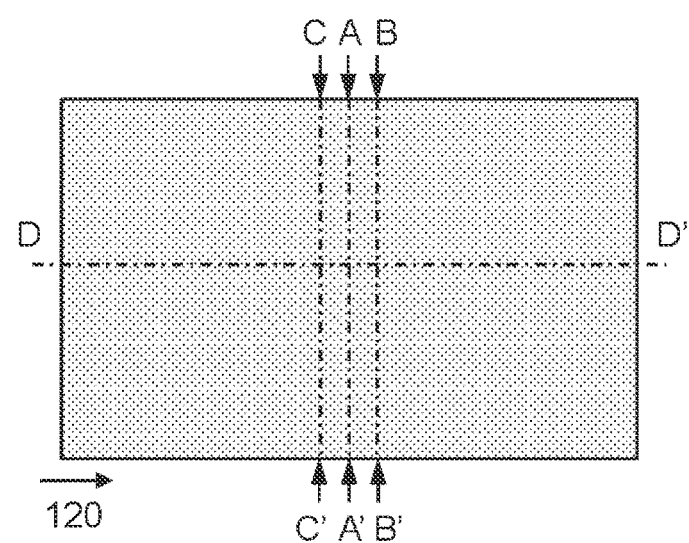

Next, using FIGS. 2A through 6B, description is given regarding a method of manufacturing a semiconductor device of the present embodiment. FIGS. 2A and 2B respectively illustrate a cross-sectional view and a plan view, spanning the region SL and the region SR, for before forming a wiring pattern arranged following an arrow direction 120 in the views. FIG. 2A is a cross-sectional view at a line D-D' of the plan view of the device region DR illustrated in FIG. 2B. FIG. 2A illustrates an element isolation region 101 formed in a substrate 100, interlayer insulation films 102 and 104 formed on the substrate 100, and a contact 103 for connecting the substrate 100 and a wiring pattern 105. These configurations do not limit the present embodiment and are merely illustrated explanatorily.

Furthermore, in FIG. 2A, an insulation film 106 is arranged by a process for arranging the insulation film 106 on the wiring pattern 105 and the interlayer insulation films 102 and 104 arranged on the substrate 100. Here, the insulation film 106 includes an insulation film 106a that serves as an etching stop layer, an insulation film 106b arranged on the insulation film 106a, and an insulation film 106c formed on the insulation film 106b that serves as an antireflection film. In the present embodiment, the insulation film 106 has a three layer structure as described above, but there is no limitation to this, and appropriate setting may be performed in accordance with a manufacturing process of the semiconductor device.

Figure 2C:
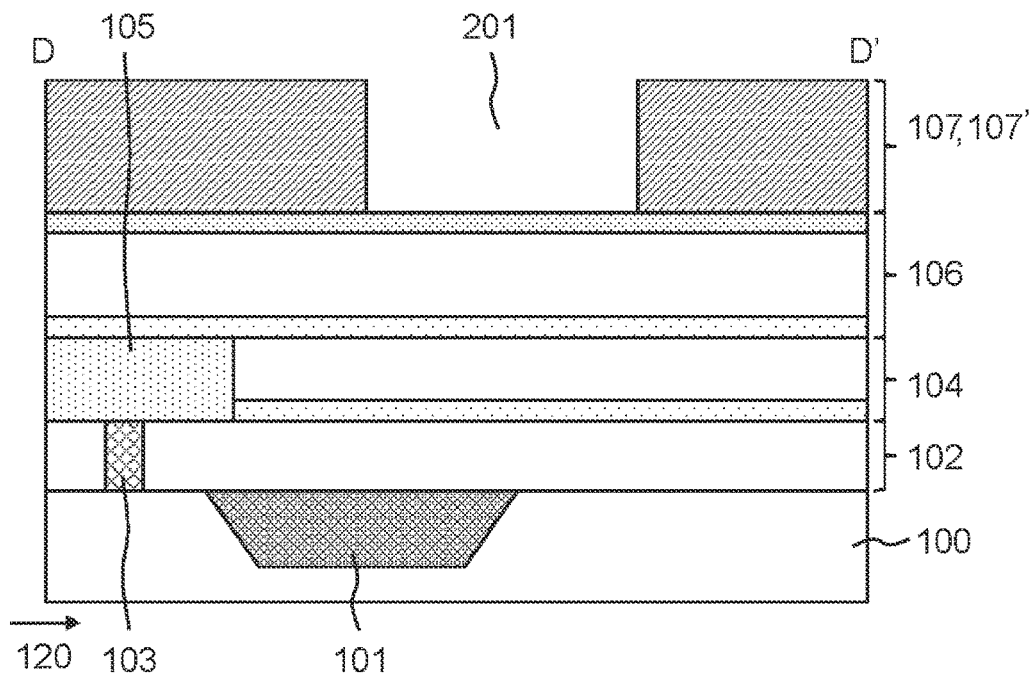
Figure 2D:
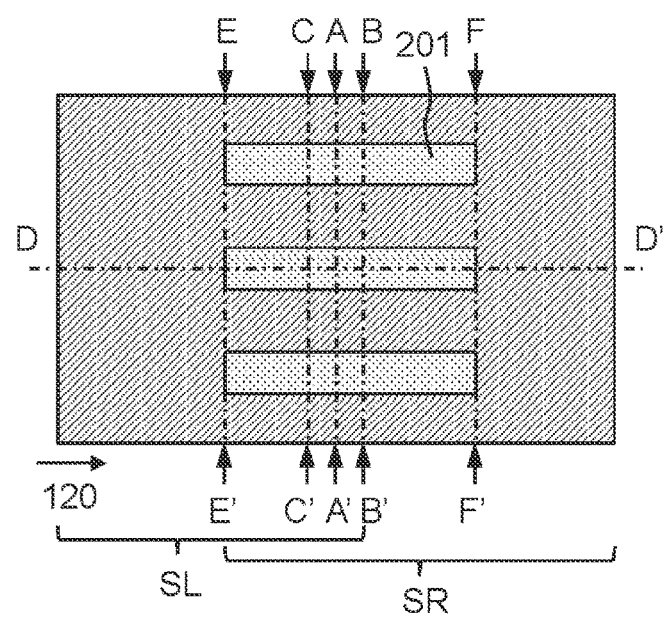

Next, description is given regarding forming the wiring pattern arranged following the direction 120, spanning the region SL and the region SR. Firstly, a process for forming holes 301 in the insulation film 106 is performed. As illustrated in FIG. 2C, a photoresist 107 is formed on the insulation film 106. Next, by exposure and development with respect to the photoresist 107, a resist pattern 107' having openings 201 at a boundary portion (between E-F) that spans the region SL and the region SR is formed. In the present specification, a region between an E-E' line and an F-F' line where the openings 201 are arranged is referred to as a boundary portion (between E-F) that spans the region SL and the region SR. As illustrated in FIG. 2D, the openings 201 are formed so as to span the region SL and the region SR and cross the line A-A', the line B-B' and the line C-C'.

Figure 3A:
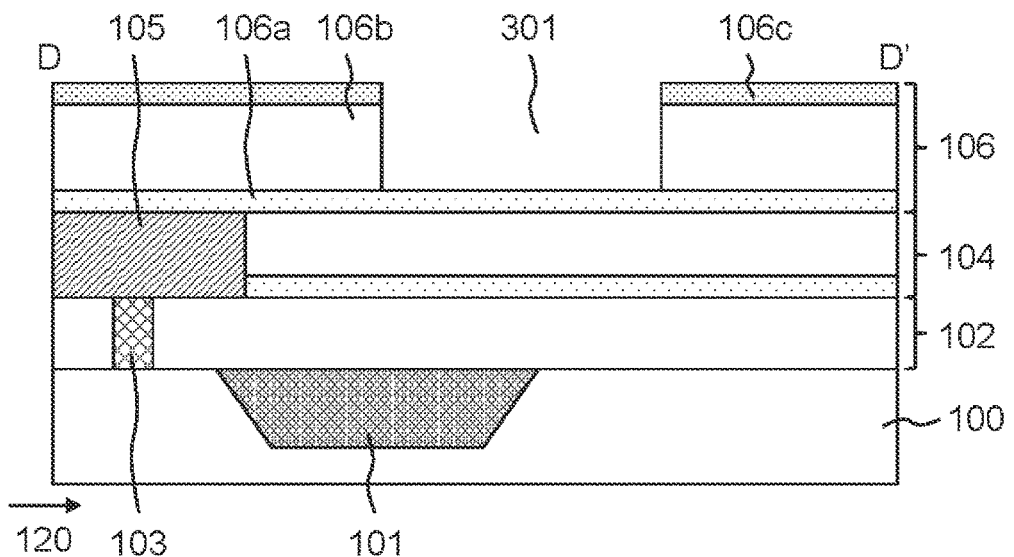
FIGS. 3A through 3D are cross-sectional views and plan views illustrating a method of manufacturing the semiconductor device of FIG. 1.
Figure 3B:
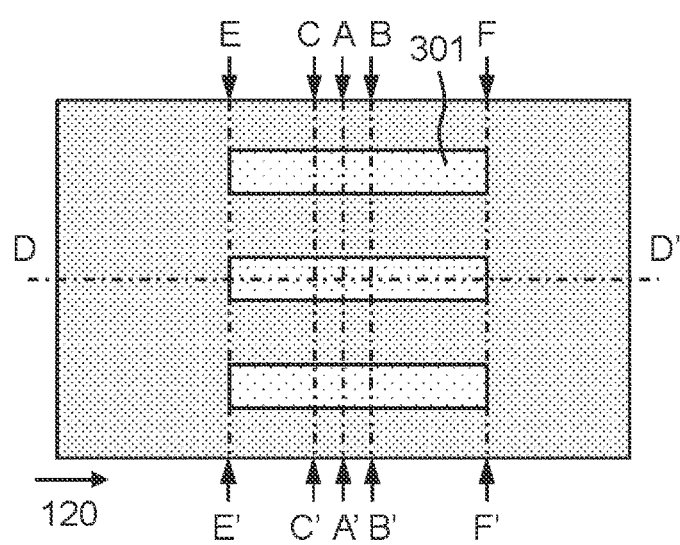
Figure 3C:
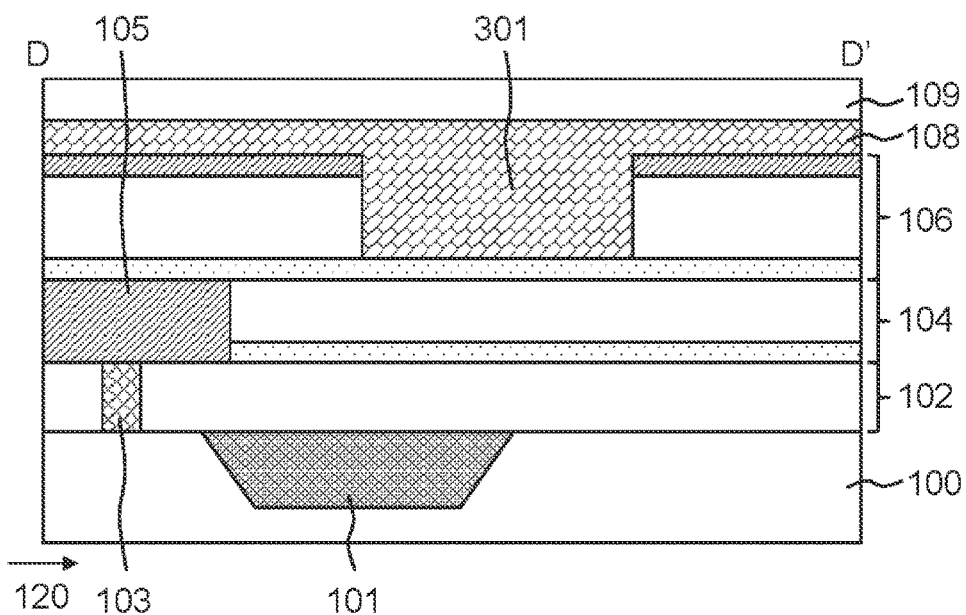
Figure 3D:
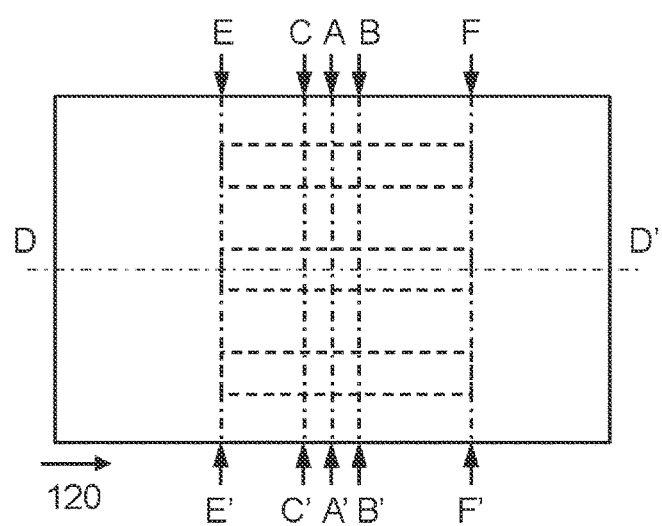

Next, the insulation film 106 is etched via the openings 201 formed in the resist pattern 107'. At that time, the insulation film 106a out of the insulation film 106 serves as the etching stop layer, and the insulation films 106b and 106c are etched. By this process, the holes 301 for forming portions arranged in the boundary portion (between E-F) out of the wiring pattern is formed in the insulation film 106. A cross-sectional view and a plan view for when the holes 301 are formed in the insulation film 106 are respectively illustrated by FIGS. 3A and 3B. Subsequently, as illustrated in FIGS. 3C and 3D, a planarizing film 108 and a hard mask layer 109 are formed above and in the holes 301. The planarizing film 108 can be a film coated using spin coating or the like, for example.

Figure 4A:
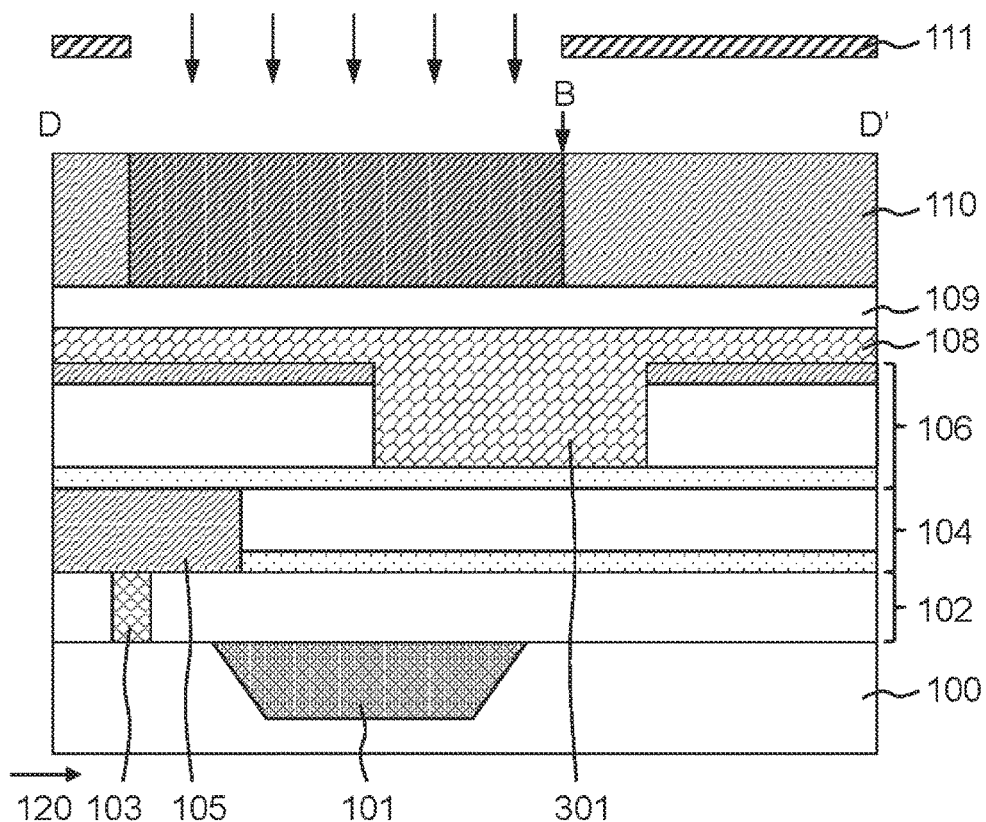
FIGS. 4A through 4D are cross-sectional views and plan views illustrating a method of manufacturing the semiconductor device of FIG. 1.
Figure 4B:
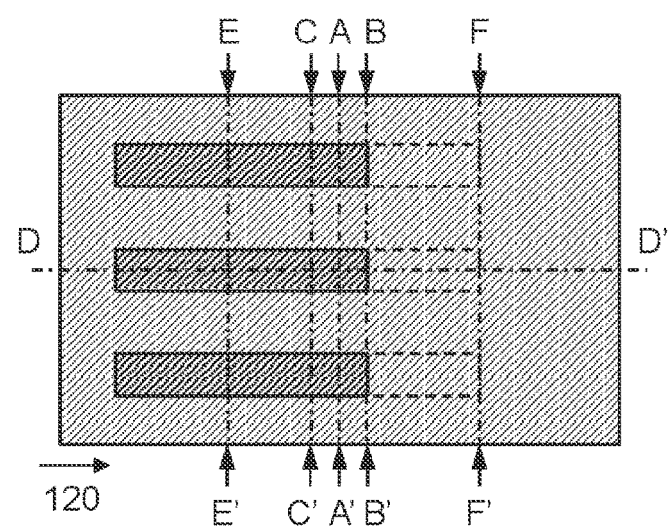
Figure 4C:
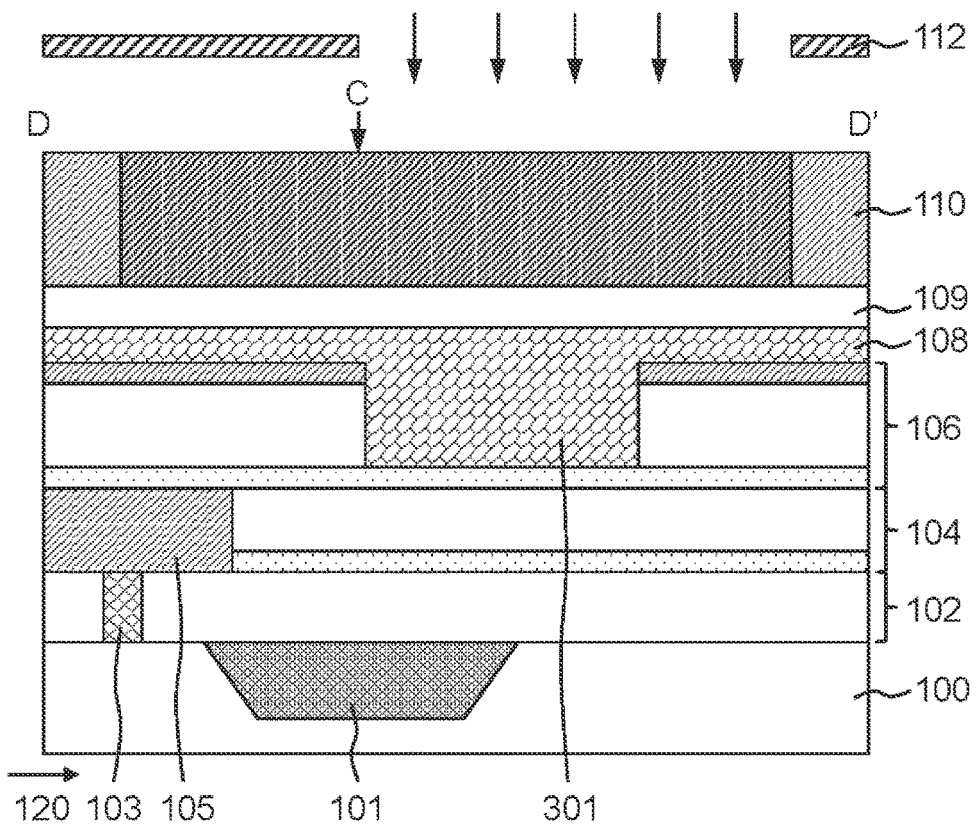
Figure 4D:
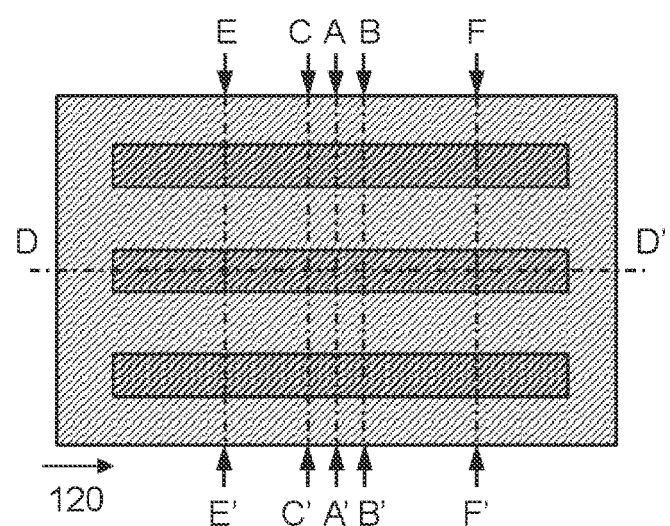

Next, a photoresist 110 is formed on the hard mask layer 109. With respect to this photoresist 110, a photo-mask 111 for forming a mask pattern for patterning the insulation film 106 of the region SL is used to perform an exposure process for exposing portions of the region SL of the photoresist 110 arranged on the insulation film 106. At this point, as illustrated in FIGS. 4A and 4B, exposure is performed for portions extended from the line B-B' of the boundary portion (between E-F) to the side of the region SL, from among the wiring pattern arranged along the direction 120 that spans the region SL and the region SR. Next, with respect to the photoresist 110, a photo-mask 112 for forming a mask pattern for patterning the insulation film 106 of the region SR is used to perform an exposure process for exposing portions of the region SR of the photoresist 110 arranged on the insulation film 106. At this point, as illustrated in FIGS. 4C and 4D, exposure is performed for portions extended from the line C-C' of the boundary portion (between E-F) to the side of the region SR, from among the wiring pattern arranged along the direction 120 that spans the region SL and the region SR. In the present embodiment, exposure of portions of the region SR is performed after exposure of portions of the region SL of the photoresist 110 is performed, but exposure of portions of the region SL may be performed after exposure of portions of the region SR is performed first.

Figure 5A:
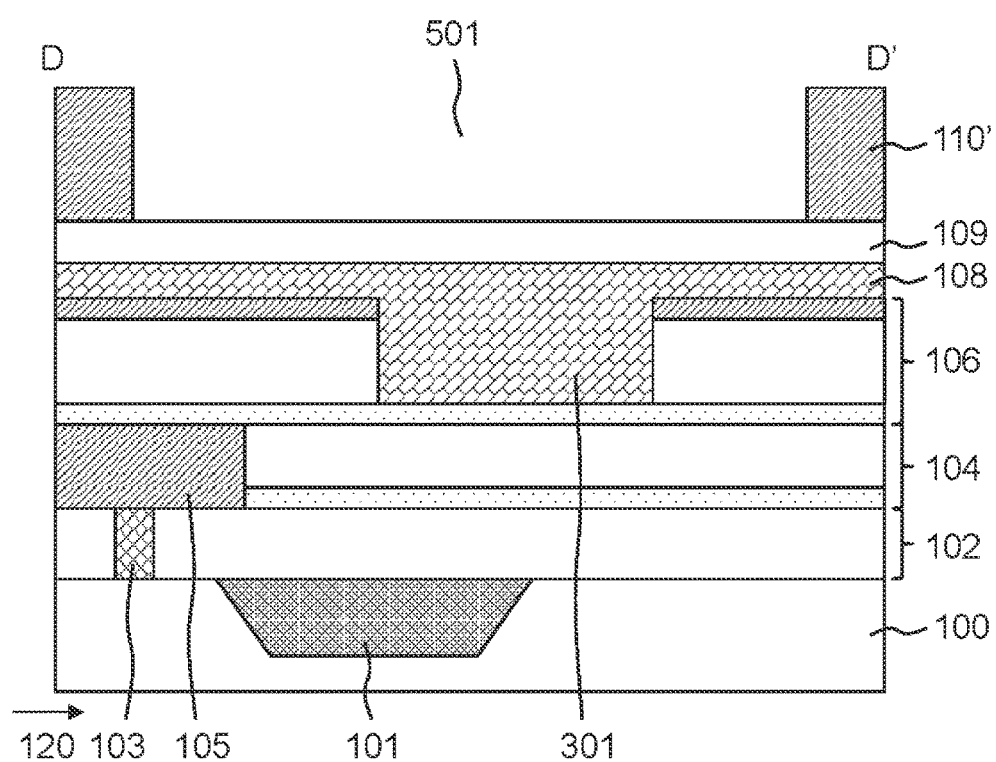
FIGS. 5A through 5D are cross-sectional views and plan views illustrating a method of manufacturing the semiconductor device of FIG. 1.
Figure 5B:
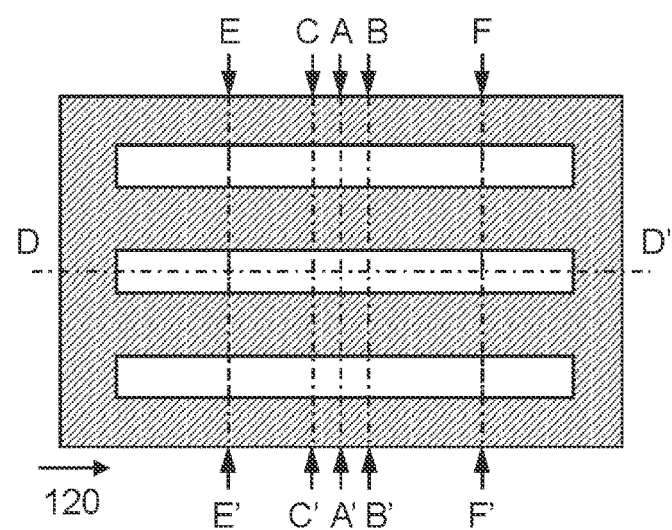

With respect to the photoresist 110, after exposure of the region SL and the region SR is performed, development processing of the photoresist 110 is performed. By this development process, as illustrated in FIGS. 5A and 5B, a resist pattern 110' that includes openings 501 that extend from the region SL to the region SR via the boundary portion (between E-F) and cross the line A-A', the line B-B', and the line C-C' are formed. The openings 501 are, from the wiring pattern, openings for forming portions (trenches 502) that extend from the boundary portion (between E-F) to the side of the region SL, and openings for forming portions (trenches 503) that extend from the boundary portion (between E-F) to the side of the region SR, but are continuously opened.

Figure 5C:
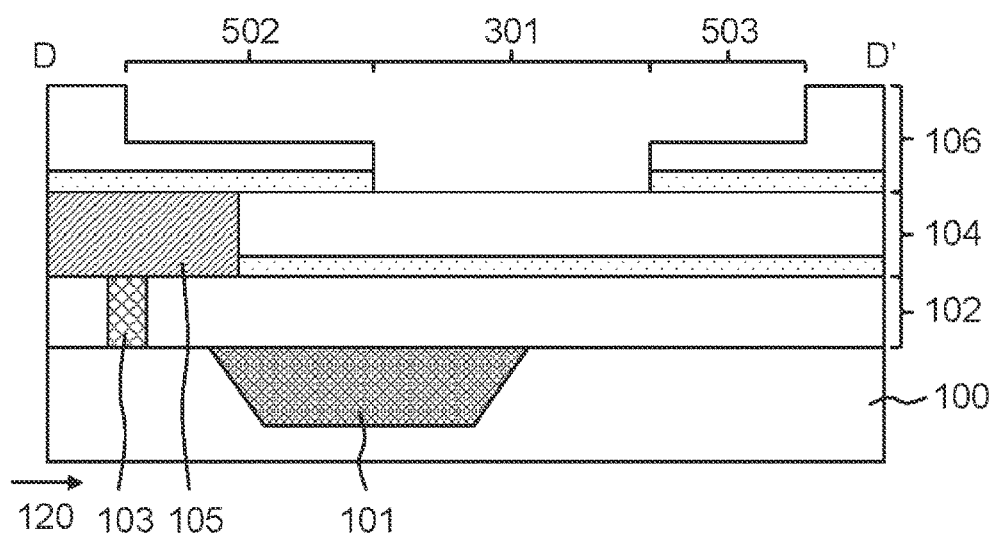
Figure 5D:
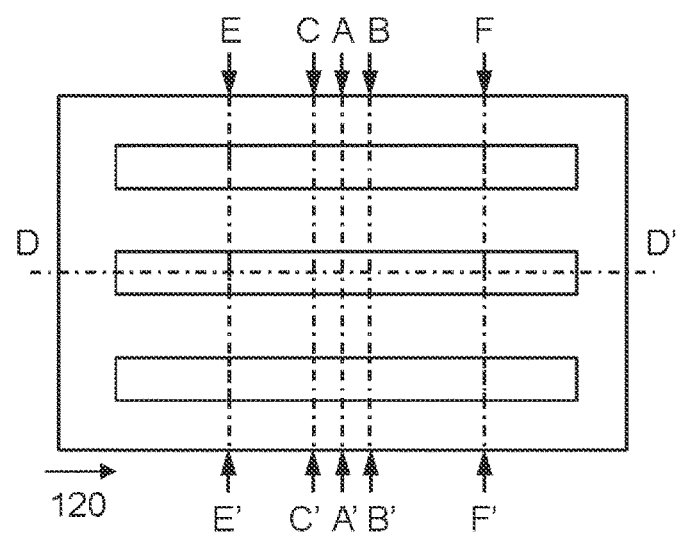

Next, a process for forming the trenches 502 and 503 in the insulation film 106 is performed by etching the insulation film 106 using the resist pattern 110' that includes the openings 501 formed in the photoresist 110 as a mask. By this process, from the wiring pattern, trenches that include the trenches 502 for forming portions that extend from the boundary portion (between E-F) to the side of the region SL, and the trenches 503 for forming portions that extend from the boundary portion (between E-F) to the side of the region SR are formed. In other words, the trenches formed at this time include the trenches 502 corresponding to the pattern formed by exposure of portions the region SL out of the resist pattern 110', and the trenches 503 corresponding to the pattern formed by exposure of portions of the region SR out of the resist pattern 110'. At this point, the trenches 502 and 503 are shallower than the holes 301 formed earlier. In other words, the holes 301 are deeper than the trenches that include the trenches 502 and 503. In addition, each of the trenches 502 and the trenches 503 communicate with the holes 301. FIGS. 5C and 5D are a cross-sectional view and a plan view for after the trenches that include the trenches 502 and 503 are formed.

Figure 6A:
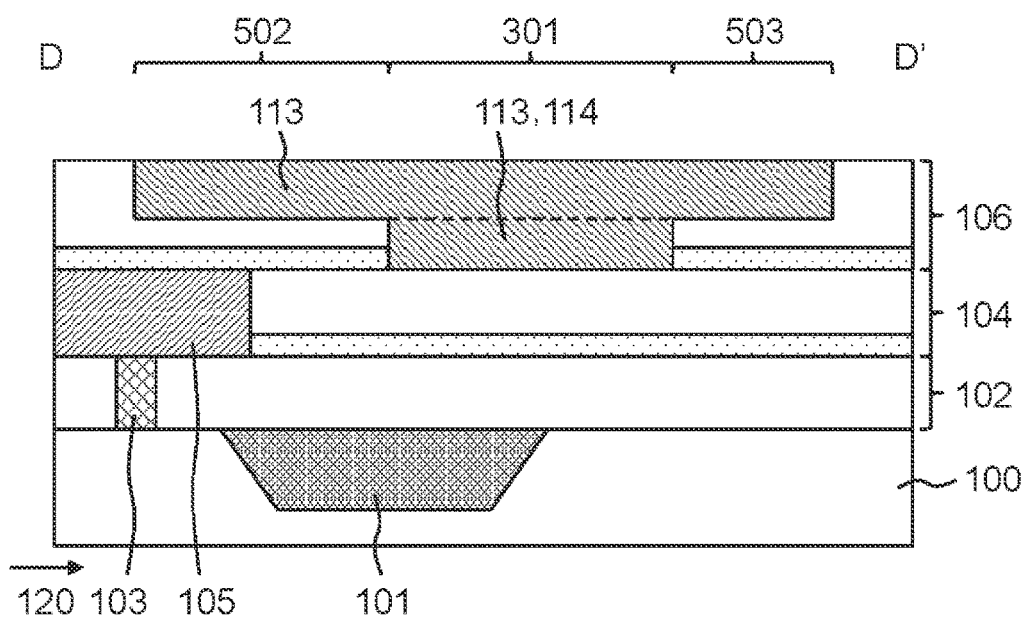
FIGS. 6A and 6B are a cross-sectional view and a plan view illustrating a method of manufacturing the semiconductor device of FIG. 1.

After the formation of the holes 301 and the trenches 502 and 503 that communicate with the holes 301, a process for embedding a conductor in the holes 301 and the trenches 502 and 503 is performed, and a wiring pattern 113 that extends following the direction 120 spanning the region SL and the region SR is formed. For the wiring pattern 113, firstly a plating method for example is used to embed the conductor in the holes 301 and the trenches 502 and 503 simultaneously by the same process. The wiring pattern 113 may be formed by next performing polishing by performing a process for performing a polishing process that uses chemical mechanical polishing (CMP) or the like for example on unnecessary conductor plated on the insulation film 106 in the vicinity of the holes 301 and the trenches 502 and 503. The wiring pattern 113 formed by using a plating method may be a wiring pattern of copper or metal that includes copper, for example. By this process, the holes 301, which are deeper than the trenches 502 and 503, are refilled by copper similarly to the trenches 502 and 503, and a portion 114 deeper than portions for the trenches 502 and 503 in the wiring pattern 113 is formed. The wiring pattern 113 includes the portion 114 arranged in the boundary portion (between E-F) that spans the region SL and the region SR. In addition, the wiring pattern 113 includes portions respectively arranged for the trenches 502 that are arranged on the portion 114 and extend from the boundary portion (between E-F) to the region SL, and the trenches 503 arranged on the portion 114 and extend from the boundary portion (between E-F) to the region SR. Here, the portion 114 of the wiring pattern 113 may be a via for when forming a wiring pattern for a dual damascene structure. In other words, the portion 114 may be a dummy via that does not connect with another wiring pattern in the boundary portion (between E-F) in the wiring pattern 113 that has a dual damascene structure. In other words, in a process for embedding a conductor in the holes 301 and the trenches 502 and 503, the bottoms of the holes 301 are configured by the interlayer insulation film 104 which is an insulator, as illustrated in FIG. 5A and FIG. 6A. The bottoms of the holes 301 may be configured by the insulation film 106 which is an insulator similarly to the interlayer insulation film 104. A cross-sectional view and a plan view for when forming the wiring pattern 113 are respectively illustrated by FIGS. 6A and 6B. In the present embodiment, it is possible to realize wiring miniaturization and a reduction of wiring resistance in order to use wiring that has a dual damascene structure with a copper as a principal component.

Figure 7A:
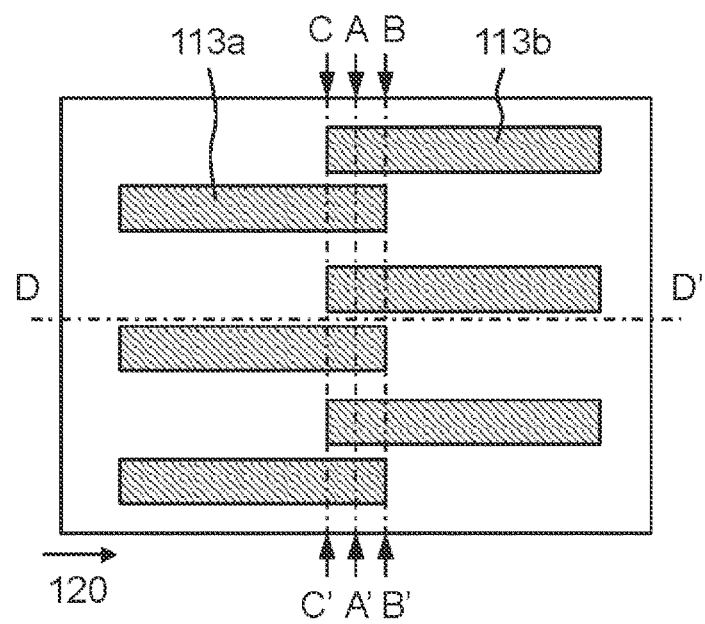
FIGS. 7A through 7D are views illustrating an effect of the semiconductor device of FIG. 1.
Figure 7B:
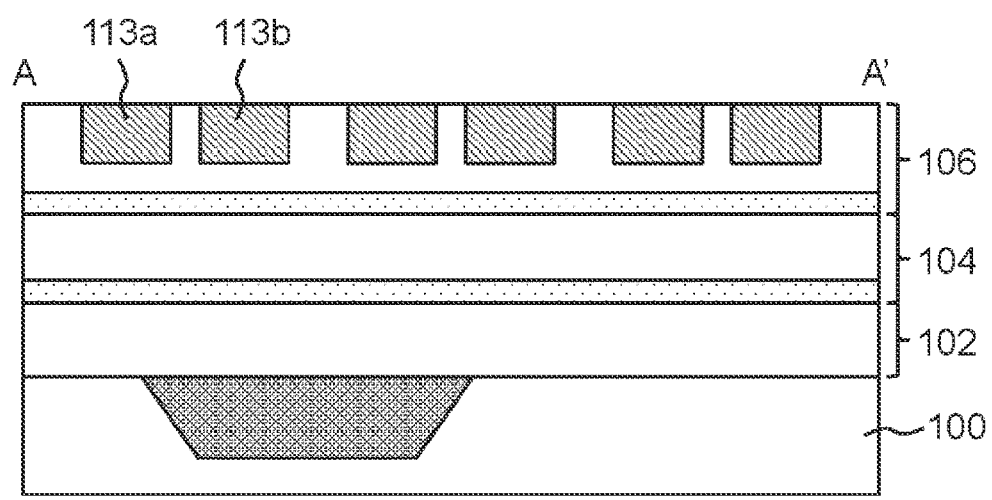

Here, FIGS. 7A through 7D are used to give an explanation regarding effects of the present embodiment. FIGS. 7A and 7B respectively illustrate a plan view and a cross-sectional view of a wiring pattern formed by a dividing exposure of a comparative example with respect to the present embodiment, and FIGS. 7C and 7D respectively illustrate a plan view and a cross-sectional view of a wiring pattern formed by a dividing exposure of the present embodiment.

FIG. 7A illustrates a plan view of a wiring pattern formed when an alignment mismatch (alignment shift) has occurred between the region SL and the region SR in a dividing exposure. FIG. 7B illustrates a cross-sectional view of a line A-A' of FIG. 7A. A wiring pattern 113a formed by a process for exposing the region SL and a wiring pattern 113b formed by a process for exposing the region SR are divided in accordance with the alignment mismatch. Accordingly, it is illustrated that the wiring pattern 113 arranged along the direction 120 that spans the region SL and the region SR is disconnected between the region SL and the region SR, and conduction cannot be achieved.

Figure 7C:
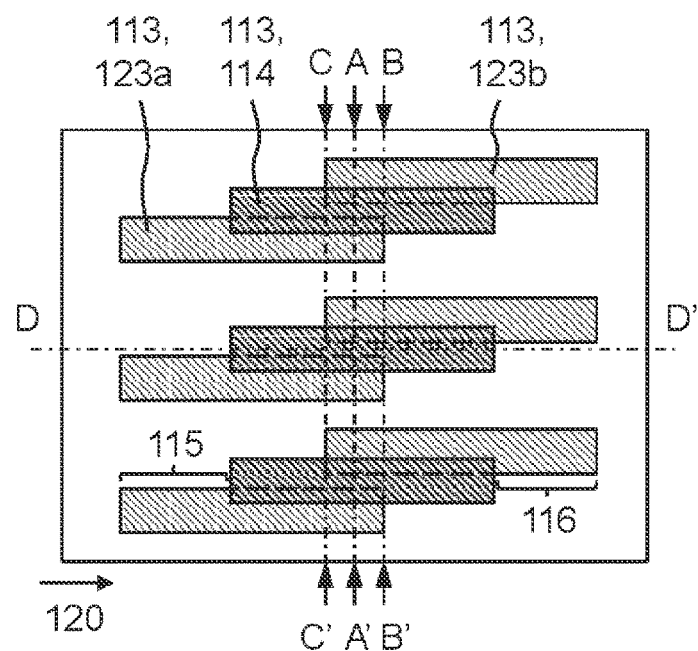
Figure 7D:
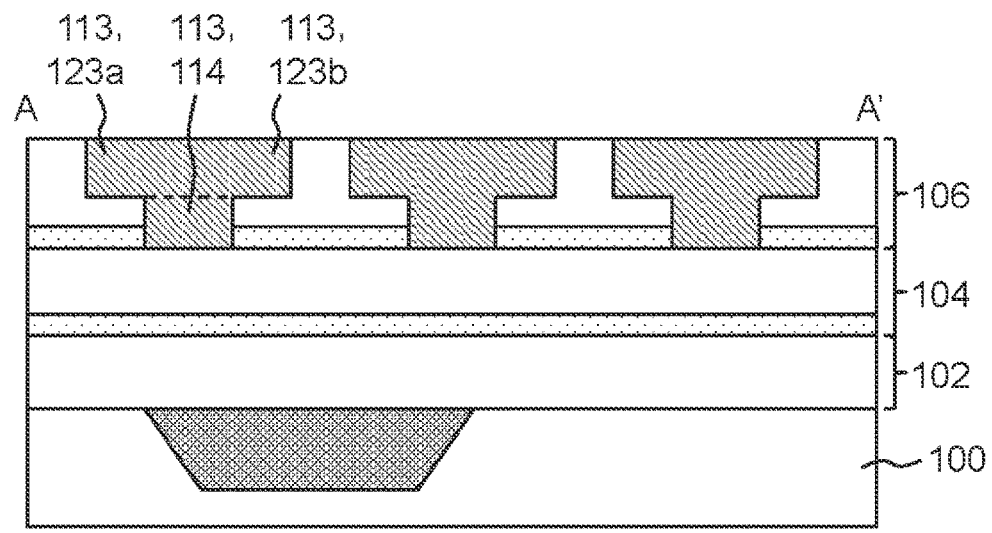

In contrast, FIG. 7C illustrates a plan view of the wiring pattern 113 formed according to the present embodiment described above. Here, the same value for alignment mismatch as the case illustrated in FIG. 7A is envisioned. FIG. 7D illustrates a cross-sectional view of a line A-A' of FIG. 7C. In the present embodiment, the wiring pattern 113a formed by a process for exposing the region SL and the wiring pattern 113b formed by a process for exposing the region SR are formed as divided due to alignment mismatch similar to that of the comparative example. However, because the portion 114 is present out of the wiring pattern 113 arranged in accordance with forming the holes 301 in the boundary portion (between E-F) that spans the region SL and the region SR, conduction between the region SL and the region SR can be ensured for the wiring pattern 113.

Figure 6B:
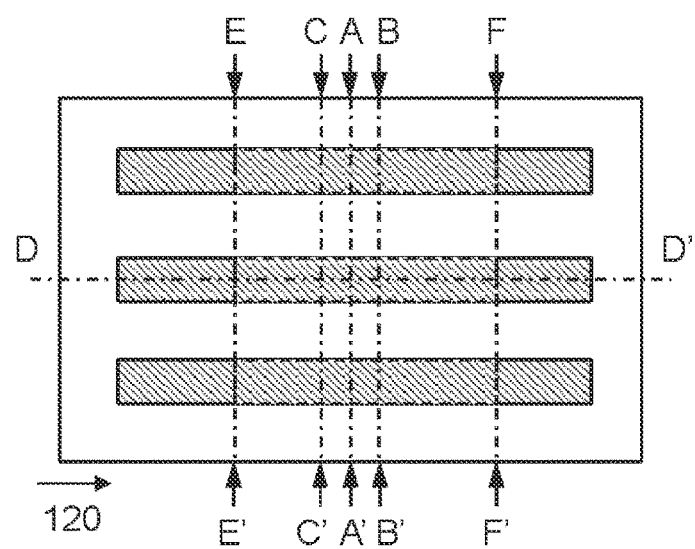

Here, description is given regarding the shape of the wiring pattern 113 in an orthogonal projection with respect to the device region DR. As illustrated in FIG. 7C, the width of the holes 301 in a direction that intersects the direction 120 in which the trenches 503 extend and the direction 120 in which the trenches 502 extend may be less than a sum of the width of the trenches 502 and the width of the trenches 503. In addition, the width of the portion 114 out of the holes 301 in a direction that intersects with the direction 120 in which the trenches 502 and 503 extend may be less than the sum of the width of the trenches 502 and the width of the trenches 503. In addition, for example, as illustrated in FIG. 7C, widths in a direction that intersects the direction 120 for the portion 114 out of the wiring pattern 113, and a portion 115 arranged on a side opposite the region SR from the portion 114 out of a portion 123a formed in the trenches 502 of the wiring pattern 113 may be approximately equal. Similarly, widths in a direction that intersects the direction 120 for the portion 114 out of the wiring pattern 113 which is deeper than other portions, and a portion 116 arranged on a side opposite the region SL from the portion 114 out of a portion 123b formed in the trenches 503 of the wiring pattern 113 may be approximately equal. Accordingly, even if there is no alignment mismatch, as illustrated in FIG. 6B, the wiring pattern 113 can be a wiring pattern in a straight line form along the direction 120 in the boundary portion (between E-F). In contrast, if there is an alignment mismatch, as illustrated in FIG. 7C, in an orthogonal projection with respect to the device region DR, a portion of an outer edge along the direction 120 of the portion 123a formed in the trenches 502 is arranged so as to overlap the portion 114. Similarly, a portion of an outer edge that follows the direction 120 out of the portion 123b formed in the trenches 503 is arranged so as to overlap the portion 114. In accordance with the alignment mismatch, one of a portion of an outer edge of the portion 123a or a portion of an outer edge of the portion 123b may be arranged so as to overlap with the portion 114, and both may be arranged so as to overlap with the portion 114. In addition, the portion 114, the portion 115, and the portion 116 respectively have the same width. Accordingly, the pattern of a photo-mask for forming the holes 301, the pattern of the photo-mask 111 for forming the trenches 502, and the pattern of the photo-mask 112 for forming the trenches 503 may respectively have the same width.

In the present embodiment, the holes 301 for forming the portion 114, the photo-mask 111 for forming the pattern for the region SL, and the photo-mask 112 for forming the pattern for the region SR are formed by different photomasks. In addition, the portion 114 of the wiring pattern 113 has a width equal to a portion formed in the trenches 502 and 503 that extends in the regions SL and SR of the wiring pattern 113.

Accordingly, in order to add an auxiliary pattern at a portion for joint line of the regions SL and SR to the wiring pattern 113, a problem such as needing to widen a wiring interval from a concern such as a short-circuit between adjacent wiring patterns does not occur. In addition, it is not the case that a plurality of wiring layers are necessary, as indicated in Japanese Patent Laid-Open No. H5-136020. In other words, in the dividing exposure, it is possible to suppress a decrease in a degree of freedom of a pattern layout.

In addition, the wiring pattern 113 that includes the portion 114 is formed simultaneously by using a plating method or the like, for example. Accordingly, no material difference or boundary structure is formed by the portion 114 and portions other than the portion 114, out of the wiring pattern 113. As a result, a rise in the resistance value of the wiring pattern 113 is suppressed, and reliability of the wiring pattern 113 may increase. In other words, in a dividing exposure, it is possible to achieve both of miniaturization of the wiring pattern that passes through a boundary between regions that are adjacent to each other, and an improvement of yield and/or reliability.

Figure 8:
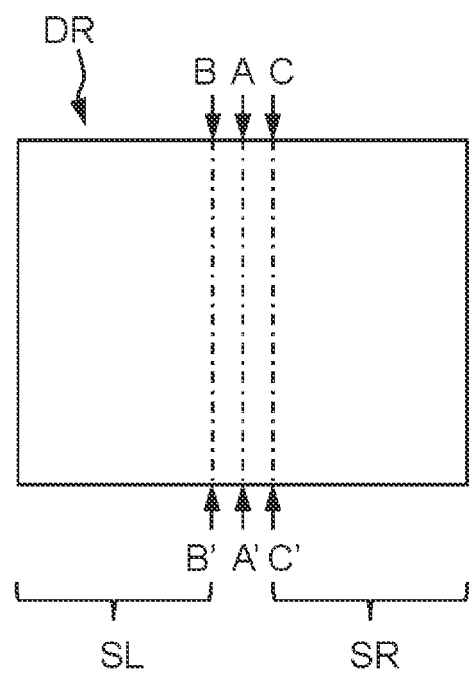
FIG. 8 is a conceptual view of an arrangement of a device region of a semiconductor device according to an embodiment of the present invention.

With reference to FIGS. 8 through 10D, description is given for a configuration of a semiconductor device according to an embodiment of the present invention, and a method of manufacturing the same. FIG. 8 is a plan view that conceptually illustrates an arrangement of a device region DR of a semiconductor device in a second embodiment of the present invention. One device region DR can be a region for one semiconductor chip. In the present embodiment, similarly to the first embodiment described above, the device region DR is divided into two regions, the region SL and the region SR, and then exposed. In contrast, as illustrated in FIG. 8, the region SL and the region SR for a dividing exposure of the device region DR differ from those of the first embodiment and do not include overlapping regions. In FIG. 8, from a left end of the device region DR to the line B-B' is the region SL which is exposed by using one photo-mask, and from the line C-C' to the right end of the device region DR is the region SR which is exposed using one photo-mask.

Next, using FIGS. 9A through 10D, description is given regarding a method of manufacturing a semiconductor device of the present embodiment. Processes for forming the holes 301 in the insulation film 106 until the planarizing film 108 and the hard mask layer 109 are formed above and in the holes 301 may be similar to processes indicated in FIGS. 2A through 3D described above, and thus description thereof is omitted here.

Figure 9A:
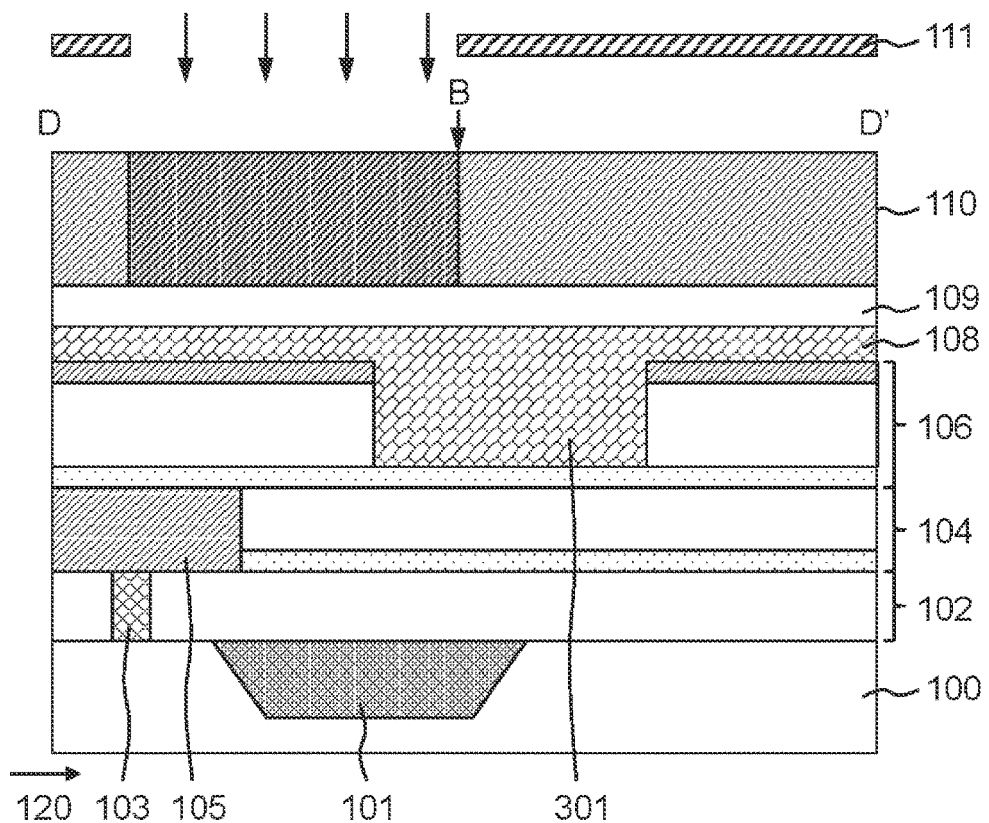
FIGS. 9A through 9D are cross-sectional views and plan views illustrating a method of manufacturing the semiconductor device of FIG. 8.
Figure 9B:
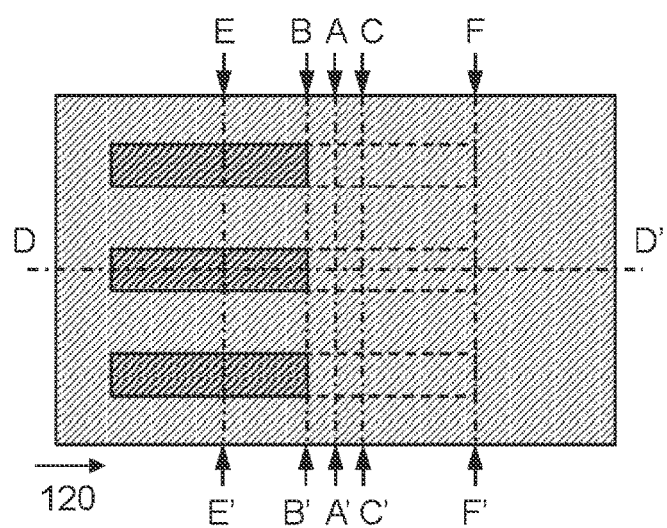
Figure 9C:
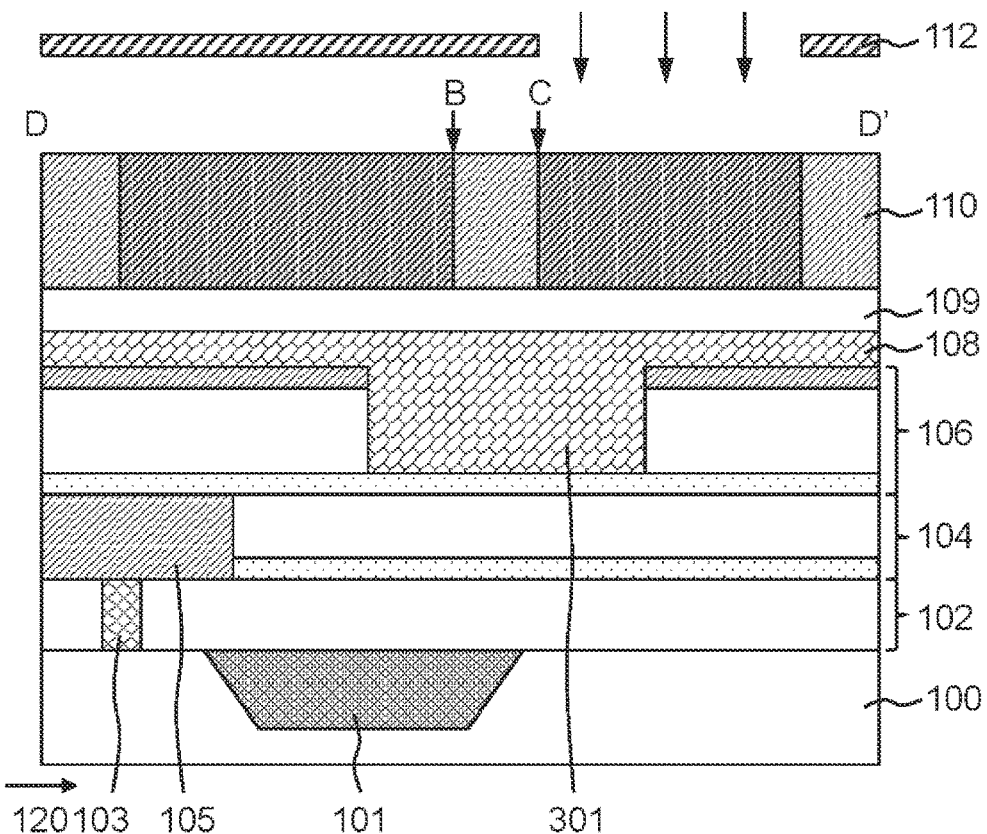
Figure 9D:
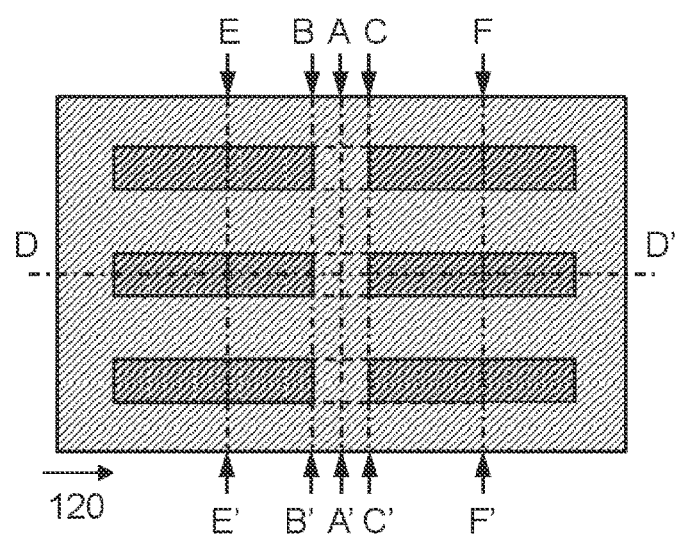

After the hard mask layer 109 is formed, the photoresist 110 is formed on the hard mask layer 109. With respect to this photoresist 110, the photo-mask 111 for forming a mask pattern for patterning the insulation film 106 of the region SL is used to perform an exposure process for exposing portions of the region SL of the photoresist 110 arranged on the insulation film 106. At this point, as illustrated in FIGS. 9A and 9B, exposure is performed for portions extended from the line B-B' of the boundary portion (between E-F) to the side of the region SL, from among the wiring pattern arranged along the direction 120 that spans the region SL and the region SR. Next, with respect to this photoresist 110, a photo-mask 112 for forming a mask pattern for patterning the insulation film 106 of the region SR is used to perform an exposure process for exposing portions of the region SR of the photoresist 110 arranged on the insulation film 106. At this point, as illustrated in FIGS. 9C and 9D, exposure is performed for portions extended from the line C-C' of the boundary portion (between E-F) to the side of the region SR, from among the wiring pattern arranged along the direction 120 that spans the region SL and the region SR. In the present embodiment, exposure of the region SR is performed after exposure of the region SL is performed, but exposure of the region SL may be performed after exposure of the region SR is performed first.

Figure 10A:
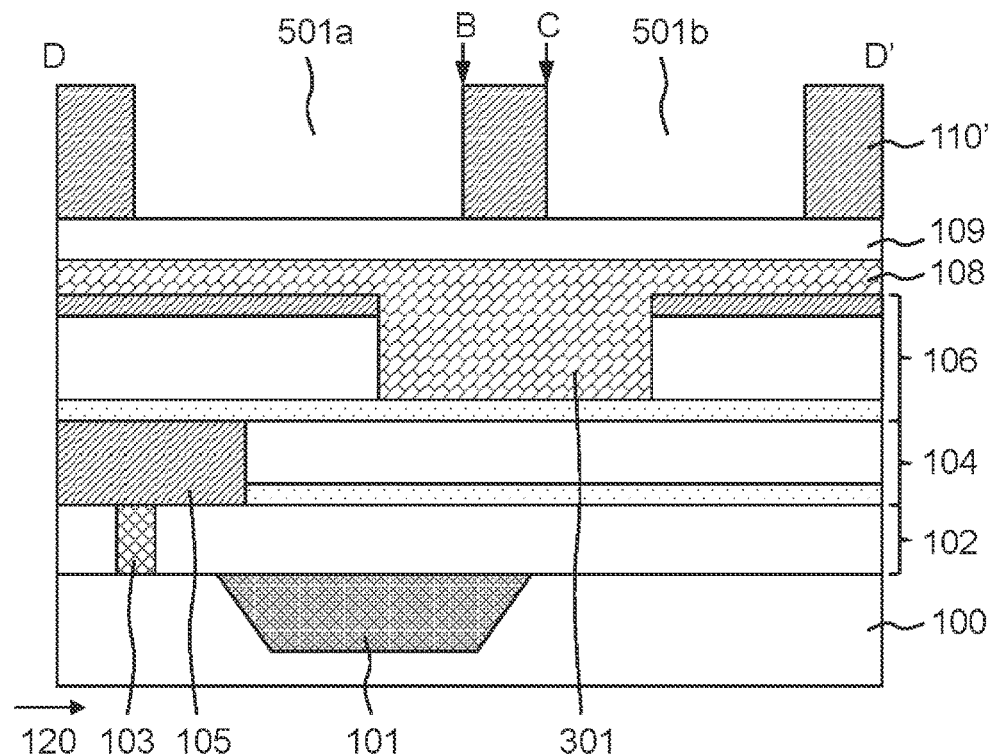
FIGS. 10A through 10D are cross-sectional views and plan views illustrating a method of manufacturing the semiconductor device of FIG. 8.
Figure 10B:
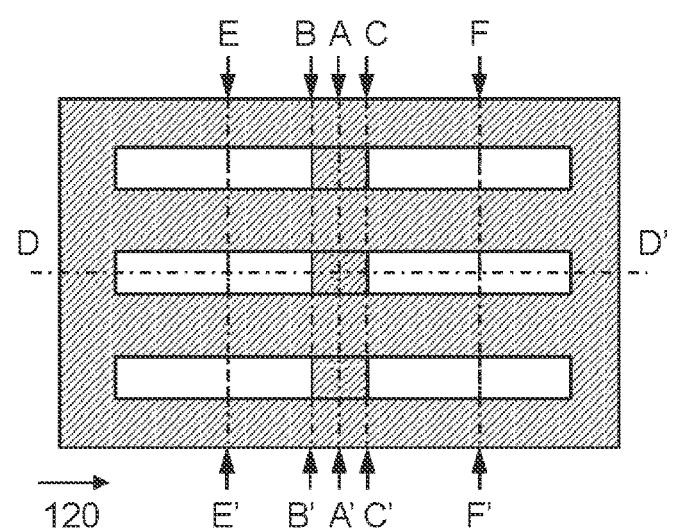
Figure 10C:
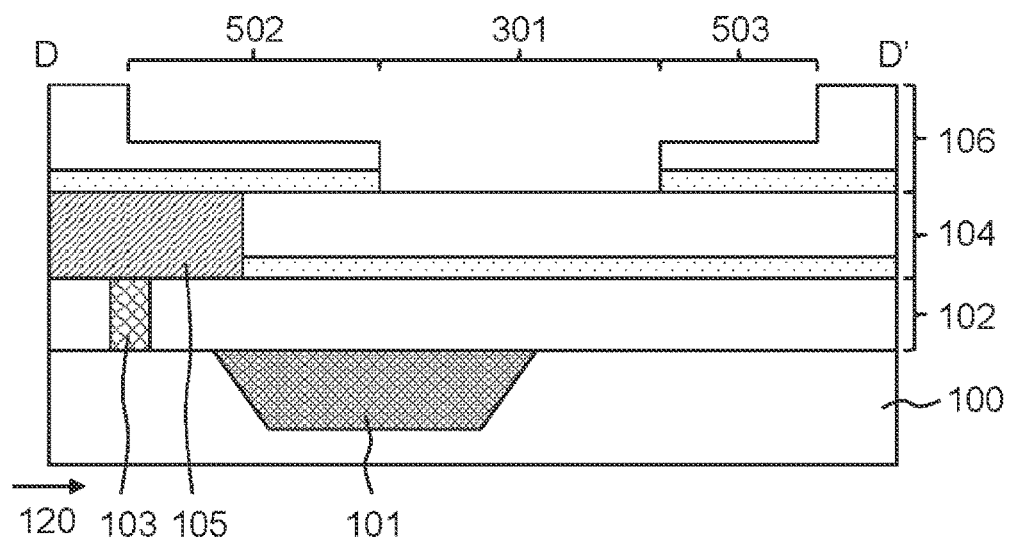
Figure 10D:
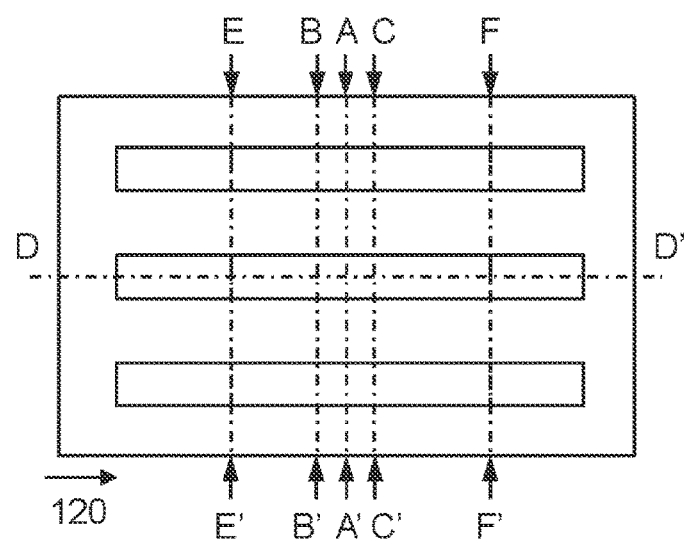

With respect to the photoresist 110, after exposure of the region SL and the region SR is performed, development processing of the photoresist 110 is performed. By this development processing process, as illustrated in FIGS. 10A and 10B, a resist pattern 110' that includes openings 501a that extend from the line B-B' in the region SL and openings 501b that extend from the line C-C' into the region SR are formed. The openings 501a and 501b are, from the wiring pattern, openings for forming portions (trenches 502) that extend from the boundary portion (between E-F) to the side of the region SL, and openings for forming portions (trenches 503) that extend from the boundary portion (between E-F) to the side of the region SR that are separated from each other. In the present embodiment, in comparison to the first embodiment, because between the line B-B' and the line C-C' out of the photoresist 110 is not exposed to exposure of the region SL, exposure of the region SR, and exposure of both, it is possible to suppress the occurrence of pattern deterioration due to double exposure.

Next, the insulation film 106 is etched via the openings 501a and 501b formed in the resist pattern 110'. Consequently, similarly to the first embodiment described above, out of the wiring pattern 113, trenches that include the trenches 502 for forming portions that extend from the boundary portion (between E-F) to a side of the region SL, and the trenches 503 for forming portions that extend from the boundary portion (between E-F) to a side of the region SR are formed. At this point, the trenches 502 and 503 are shallower than the holes 301 formed earlier. Because subsequent processes may be the same as in the first embodiment which is described above, description thereof is omitted here.

In the present embodiment, in a dividing exposure, it is possible to suppress nonconduction of a wiring pattern that extends spanning across regions adjacent to each other, and achieving both of improvement of yield and/or reliability, and miniaturization of the wiring pattern.

Two embodiments according to the present invention were described above, but it goes without saying that the present invention is not limited to these embodiments, and the embodiments described above can be appropriately changed and combined in a scope that does not deviate from the spirit of the present invention.

Figure 11:
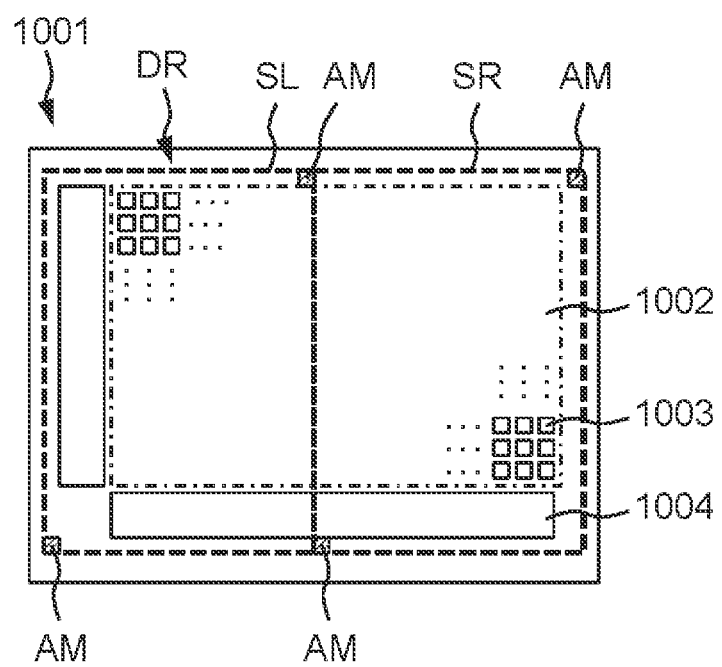
FIG. 11 is a view illustrating an example of applying the semiconductor device of the present invention to an image sensing device.

FIG. 11 illustrates an example of an image sensing device 1001 as a semiconductor device that is manufactured by using the present embodiment. A device region DR of the image sensing device 1001 includes a pixel region 1002 in which a plurality of pixels 1003 that each include a conversion element for generating a signal in accordance with incident light are arranged in an array, and a circuit region 1004 for causing the pixels 1003 of the pixel region 1002 to operate. Here, the pixels 1003 can be configured by using a CMOS circuit or the like, for example. The pixels 1003 may be a front-side illumination image sensing device where transistors are provided on a surface of the substrate 100, and the surface is a light receiving surface. Alternatively, configuration may be taken to have a back-side illumination image sensing device where transistors are provided on a surface of the substrate 100, and a back surface opposite of this surface is a light receiving surface. If the size of the pixel region 1002 held by the semiconductor device is greater than or equal to 33 mm×22 mm, there will be more requests for exposing the device region DR after dividing it. For example, there is a case of manufacturing the image sensing device 1001 where the pixel region 1002 that is has is 36 mm×24 mm (rounding performed after the decimal point), which is referred to as so-called full-size, or is larger than that. In such a case, by exposing, dividing into the region SL and the region SR as described above, even if there is a wiring pattern that extends to span exposed regions, it is possible to suppress nonconduction of the wiring pattern, and manufacture the image sensing device 1001 to have high reliability. In addition, the device region DR of the image sensing device 1001 being formed in accordance with a dividing exposure can be confirmed from, for example, an arrangement of an alignment mark AM arranged for exposure of the device region DR, distortion of the regions SL and SR that are respectively subject to the dividing exposure, or the like. Note that, even if the semiconductor device is a display device such as an organic EL display device, a transmissive type or reflective type liquid crystal display device, or the like, it is possible to achieve a similar effect as for an image sensing device, and it is possible to realize a display device having a pixel region that has subject to an increase in fineness in a large area.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-083039, filed Apr. 19, 2017, which is hereby incorporated by reference wherein in its entirety.

What is claimed is:

1. A method of manufacturing a semiconductor device, the method comprising:
arranging an insulation film on a substrate;
forming a hole in the insulation film;
first exposing for exposing a first portion of a photoresist arranged on the insulation film;
second exposing for exposing a second portion of the photoresist after the first exposing;
forming a resist pattern by developing the photoresist after the first exposing and the second exposing;
forming a trench in the insulation film in accordance with etching the insulation film using the resist pattern as a mask; and
embedding a conductor in the hole and the trench,
wherein the trench includes a first trench corresponding to a first pattern of the resist pattern, the first pattern being formed by the exposing of the first portion, and a second trench corresponding to a second pattern of the resist pattern, the second pattern being formed by the exposing of the second portion,
wherein, in the embedding of the conductor, both the first trench and the second trench communicate with the hole, the hole comprises a part that is deeper than the first trench and the second trench, and the conductor comprises a portion in the part of the hole, and
wherein, in a plan view, an inner edge of the part of the hole surrounds the portion of the conductor and does not surround an insulator.

2. The method according to claim 1, wherein, in the resist pattern, an opening for forming the first trench and an opening for forming the second trench are contiguously opened.

3. The method according to claim 1, wherein, in the resist pattern, an opening for forming the first trench and an opening for forming the second trench are respectively separated.

4. The method according to claim 1, further comprising performing a polishing process of the conductor after the embedding.

5. The method according to claim 1, wherein the first exposing is performed after the hole is formed.

6. The method according to claim 1, wherein a width of the hole in a direction that intersects a direction in which the first trench extends and a direction in which the second trench extends is less than a sum of a width of the first trench and a width of the second trench.

7. A method of manufacturing a semiconductor device, the method comprising:
arranging an insulation film on a substrate;
forming a hole in the insulation film;
first exposing for exposing a first portion of a photoresist arranged on the insulation film;
second exposing for exposing a second portion of the photoresist after the first exposing;
forming a resist pattern by developing the photoresist after the first exposing and the second exposing;
forming a trench in the insulation film in accordance with etching the insulation film using the resist pattern as a mask; and
embedding a conductor in the hole and the trench,
wherein the trench includes a first trench corresponding to a first pattern of the resist pattern, the first pattern being formed by the exposing of the first portion, and a second trench corresponding to a second pattern of the resist pattern, the second pattern being formed by the exposing of the second portion, and
wherein, in the embedding of the conductor, both the first trench and the second trench communicate with the hole, the hole comprises a part deeper than the first trench and the second trench, and a bottom of the part of the hole is configured by an insulator.

8. The method according to claim 1, wherein the conductor includes copper.

9. The method according to claim 1, wherein the semiconductor device is an image sensing device or a display device.

10. The method according to claim 1, wherein the semiconductor device has a pixel region in which a plurality of pixels are arranged across a region exposed by the first exposing and a region exposed by the second exposing, and a size of the pixel region is greater than or equal to 33 mm ×22 mm.

11. A semiconductor device comprising a device region that includes a first region and a second region adjacent to each other,
wherein the semiconductor device has a substrate and a wiring pattern above the substrate,
wherein the wiring pattern extends following a first direction spanning the first region and the second region, connects a circuit arranged in the first region and a circuit arranged in the second region, and is embedded in an insulation film on the substrate, wherein the wiring pattern has a first portion arranged in a boundary portion that spans the first region and the second region, a second portion that extends from the boundary portion to a side of the first region, a third portion that extends from the boundary portion to a side of the second region, a fourth portion in the boundary portion, wherein the fourth portion is arranged between the second portion and the third portion, the first portion is arranged between the fourth portion and the substrate, and the fourth portion is continuous with the first portion, the second portion, and the third portion, and wherein a distance between the first portion and the substrate is smaller than a distance between the second portion and the substrate, and is smaller than a distance between the third portion and the substrate.

12. The semiconductor device according to claim 11, wherein the semiconductor device is an image sensing device or a display device.

13. The semiconductor device according to claim 11, wherein the semiconductor device has a pixel region in which a plurality of pixels are arranged across the first region and the second region, and a size of the pixel region is greater than or equal to 33 mm ×22 mm.

14. The semiconductor device according to claim 11, wherein a bottom of the first portion is in contact with the insulation film.

15. The semiconductor device according to claim 11, wherein the first portion is a dummy via that is not connected to another wiring pattern in the boundary portion in the wiring pattern.

16. The semiconductor device according to claim 11, wherein in a plan view, the wiring pattern has two steps in the boundary portion.

17. The semiconductor device according to claim 11, wherein the wiring pattern connects a transistor of the circuit arranged in the first region and a transistor of the circuit arranged in the second region.

18. The semiconductor device according to claim 11, wherein, in a plan view, an inner edge of the insulation film surrounds the first portion of the wiring pattern and does not surround an insulator.

19. The semiconductor device according to claim 11, wherein, in an orthogonal projection with respect to the device region, at least one of a portion of an outer edge that follows the first direction out of the second portion and a portion of an outer edge that follows the first direction out of the third portion is arranged so as to overlap the first portion.

20. The semiconductor device according to claim 11, wherein, in an orthogonal projection with respect to the device region, the first portion is arranged between a part of an outer edge that follows the first direction out of the second portion and a part of an outer edge that follows the first direction out of the third portion.

* * * * *